United States Patent [19]

Armstrong

[11] Patent Number: 4,561,070
[45] Date of Patent: Dec. 24, 1985

[54] INTEGRATED CIRCUIT MEMORY

[75] Inventor: Bruce G. Armstrong, Belmont, Calif.

[73] Assignee: Raytheon Company, Lexington, Mass.

[21] Appl. No.: 510,058

[22] Filed: Jul. 1, 1983

[51] Int. Cl.⁴ .............................................. G11C 7/00
[52] U.S. Cl. ................................................. 365/227
[58] Field of Search ............... 365/226, 227, 230, 231, 365/189

[56] References Cited

U.S. PATENT DOCUMENTS 4,174,541 11/1979 Schmitz ............................... 365/227
4,470,133 9/1984 Tanimoto ............................ 365/227

FOREIGN PATENT DOCUMENTS 2060303 4/1981 United Kingdom ................ 365/227

Primary Examiner—Joseph A. Popek
Attorney, Agent, or Firm—Richard M. Sharkansky; Joseph D. Pannone

[57] ABSTRACT

An integrated circuit memory is provided wherein an array of memory elements is addressed by a decoder circuit responding to an address signal. The decoder circuit includes a plurality of sections, each one thereof being used to address a different section of the array. A decoder section selector is provided which, in response to the addressing signal, determines the section of the array being addressed and electrically couples the one of the plurality of decoder circuit sections which is coupled to such addressed array section to a power source while electrically decoupling the remaining section of the decoder circuit from such power source. With such arrangement, only a portion of the decoder circuit is electrically coupled to the power source when addressing the array thereby reducing the power consumption of the integrated circuit memory.

2 Claims, 6 Drawing Figures

INTEGRATED CIRCUIT MEMORY

BACKGROUND OF THE INVENTION

This invention relates generally to integrated circuit memories and more particularly to memories having a relatively large storage capacity.

As is known in the art, it is generally desirable to increase the memory storage capacity of integrated circuit memories. However, as the memory capacity of the integrated circuit increases the power requirements of the circuit correspondingly increases. For example, in a bipolar read-only memory (ROM) circuit the cross points of rows and columns of conductors correspond to the memory locations of the circuit. The presence, or absence, of an electrical connection between the row and column conductors at a particular cross point determines the logical state of the bit stored at the corresponding memory location. Once programmed, the data is read from a particular location by coupling address signals to row and column decoders to select the particular row and column conductors which "cross" at the addressed location. As is known in the art, for such memory circuit these decoders generally require power for their operation and, as the size or capacity of the memory circuit increases, the size of the decoders correspondingly increase in order to provide addressing to an increased number of rows and columns of conductors. More particularly, the decoders generally include logic gates and diode matrices so that when a larger number of gates and/or matrices is used in the decoders, extra power is consumed by the additional resistors in such gates and matrices. One way which may be used to decrease the power consumption of the increased capacity decoders is to increase the resistance of these resistors; however, the increased resistance increases the switching time of the decoder thereby resulting in a more slowly responding ROM circuit.

SUMMARY OF THE INVENTION

In accordance with the present invention, an array of memory elements is provided with a decoder circuit responsive to an address signal for selectively addressing the memory elements in the array, such decoder circuit having a plurality of sections each one thereof addressing a different section of the array. A decoder section selector is also provided for electrically coupling the one of the decoder sections which is addressing the array in response to the address signal to a power source while electrically decoupling the remaining non-array addressing decoder sections from such power source.

In a preferred embodiment of the invention, the decoder circuit responds to a N-bit address signal to address one of $2^{(N)}$ rows of the array of memory elements with each one of sections of the decoder circuit addressing a different one portion of the rows. The decoder section selector responds to the addressing signal to couple the one of the decoder sections which is coupled to the section of the array having therein the addressed row of memory elements while electrically decoupling from the power source the remaining decoder sections. Thus, the decoder section selector responds to the addressing signals to identify which section of the array of memory elements which contains the row of elements addressed by the addressing signals and couples power to only that one of the decoder sections. With such arrangement, by activating only a portion of the decoder circuit the power comsumption of the memory circuit is reduced without increasing the resistance of resistors used in the decoder circuit.

BRIEF DESCRIPTION OF THE DRAWINGS

The above-mentioned and other features of the invention will now be more apparent by reference to the following description taken together in conjunction with the accompanying drawings, in which.

DESCRIPTION OF THE PREFERRED EMBODIMENT

Figure 1:
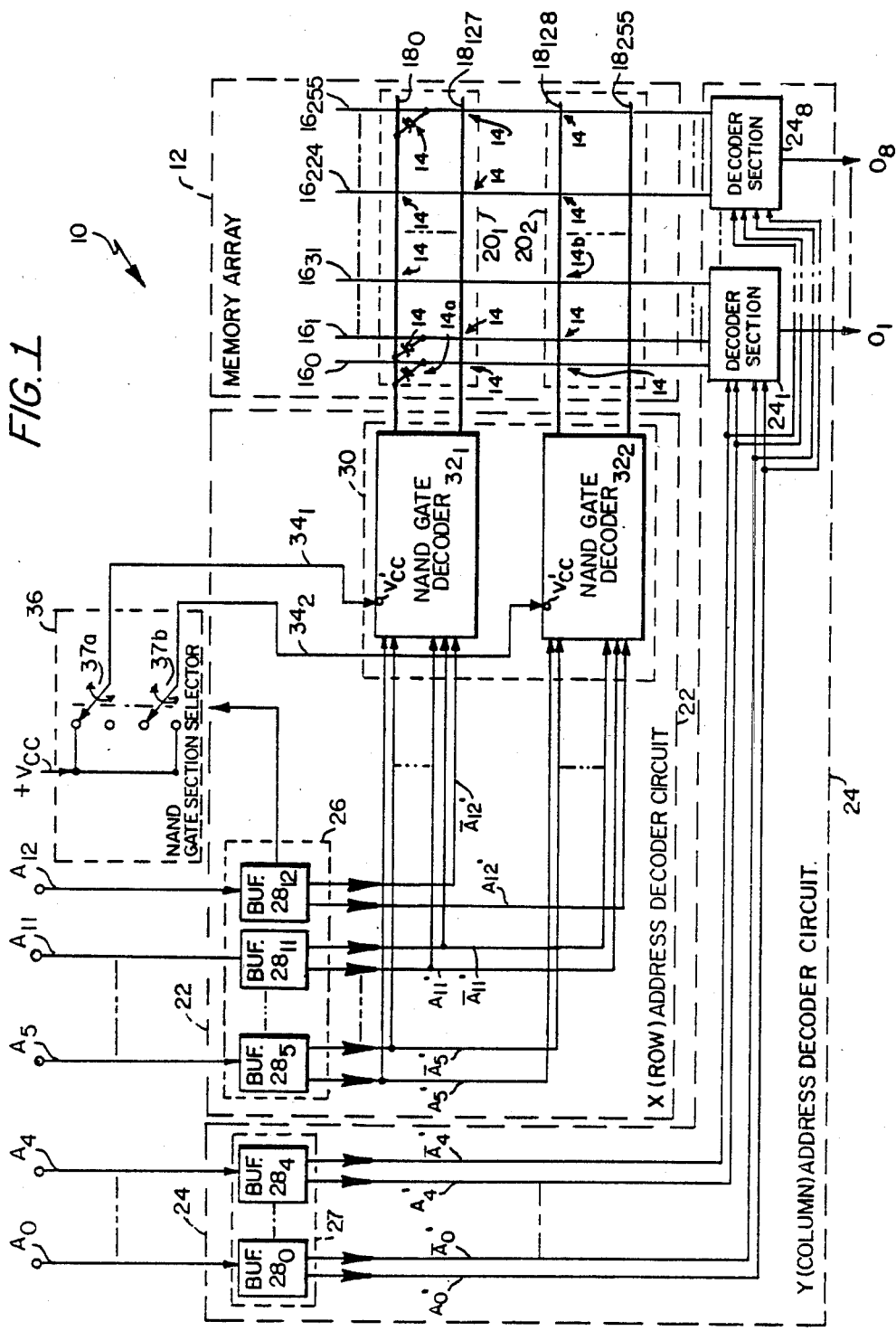
FIG. 1 is a schematic diagram of an integrated circuit memory in accordance with the invention.

Referring now to FIG. 1, an integrated circuit memory 10, here a read-only memory (ROM), is shown to include a memory array 12 of memory elements 14, here an array of 65,536 memory elements 14 for storing 8,192 different 8 bit digital words. The memory elements 14 are here arranged in 256 rows and 256 columns. The columns of memory elements 14 are arranged in 8 different sets each one of such 8 sets having 32 columns of memory elements 14. Thus, here the memory array 12 includes a plurality of, here 256, columns of conductors $16_0$–$16_{255}$ and a plurality of, here 256, rows of conductors $18_0$–$18_{255}$ with memory elements 14, here diodes, electrically connected or electrically disconnected between the rows and columns of conductors, as indicated, selectively in accordance with the preprogrammed state of the memory array 12. As is well known in the art, the presence, or absence, of an electrically connected diode represents the logical state or binary data stored at the location in the memory array 12 corresponding to the "cross point" particular row and column conductor. Thus, the presence of a connected diode, such as diode 14a, indicates, for example, storage of a logical 1 at the location represented by column conductor $16_0$ and row conductor $18_0$; whereas the disconnected diode 14b represents a logical 0 at the location represented by column conductor $16_{31}$ and row conductor $18_{128}$.

The words stored in the memory array 12 are addressed by a 13 bit addressing signal fed to terminals $A_0$–$A_{12}$, with the least significant bit (LSB) of such addressing signal is fed to terminal $A_0$ and the most significant bit (MSB) of such addressing signal is fed to terminal $A_{12}$. The 5 least significant bits of the addressing signal (i.e. those fed to terminals $A_0$–$A_4$) are used to select one of the 32 columns of conductors $16_0$–$16_{31}$ to $16_{224}$–$16_{255}$ in each of the 8 sets thereof while the 8 higher order bits of the addressing signal (i.e. those fed to terminals $A_5$–$A_{12}$) are used to address one of the 256 rows of conductors $18_0$–$18_{255}$. It is further noted that the memory array 12 is partitioned into two array sections $20_1$ and $20_2$, as indicated. Array section $20_1$ includes row conductors $18_0$–$18_{127}$, column conductors $16_0$–$16_{255}$ and the memory elements 14 at the cross points thereof, while array section $20_2$ includes row conductors $18_{128}$–$18_{255}$, column conductors $16_0$–$16_{255}$ and the memory elements 14 at the cross points thereof. It is here noted that here when the most significant bit fed to terminal $A_{12}$ is a logical 0 (i.e. a "low" voltage signal), one of the 128 conductors $18_0$–$18_{127}$ in array section $20_1$ is being addressed to thereby address the row of memory elements 14 in the array section $20_1$ whereas when the logical state of the most significant bit fed to terminal $A_{12}$ is a logical 1 (i.e. a "high" voltage), one of the rows of conductors $18_{128}$–$18_{255}$ in array section $20_2$ is being addressed to thereby address the row of memory elements 14 in array section $20_2$.

The integrated circuit memory 10 includes an X (or row) address decoder circuit 22 fed by terminals $A_5$–$A_{12}$ and a Y (or column) address decoder circuit 24 fed by terminals $A_0$–$A_4$, as indicated. The Y (or column) address decoder circuit 24 includes a plurality of, here, 8 decoder sections $24_1$–$24_8$, as indicated, each one of such decoder sections $24_1$–$24_8$ being coupled to the corresponding one of the 8 different sets of column conductors $16_0$–$16_{255}$, as indicated. Further, each one of the decoder sections $24_1$–$24_8$ in response to binary signals fed to terminals $A_0$–$A_4$, electrically couples one of the 32 column conductors coupled to each one of the decoder sections $24_1$–$24_8$ to a corresponding one of eight output terminals $0_1$–$0_8$, as indicated, thus reading the 8 bits of stored data in the array 12 for the addressed word on terminals $0_1$–$0_8$.

The X (or row) decoder 22 and Y (or column) decoder circuit 24 include buffer sections 26, 27 comprising a plurality of here 13 buffers $28_0$–$28_{12}$ each one of such buffers $28_0$–$28_{12}$ being coupled to a corresponding one of the terminals $A_0$–$A_{12}$ respectively, as indicated. Each one of the buffer circuits $28_0$–$28_{12}$ is identical in construction and an exemplary one thereof, here buffer circuit $28_{12}$ is shown in detail in FIG. 2 and will be described hereinafter. Suffice it to say here, however, that each one of the buffer circuits $28_0$–$28_{12}$ produces a true and complement signal of the binary signal fed to such buffer circuit. Thus, buffer circuits $28_0$–$28_{12}$ provide "true" signals of the bits of the addressing signals fed to terminals $A_0$–$A_{12}$ on lines $A_0'$–$A_{12}'$ respectively and complement signals of the such bits on lines $A_0'$–$A_{12}'$ respectively. The "true" and "complement" signals on lines $A_5'$–$A_{12}'$ and $A_5'$–$A_{12}'$ provided by the buffer section 26 of the X address decoder circuit 22 are fed to a NAND gate decoder section 30, as shown. The NAND gate decoder section 30 includes a plurality of, here 2, NAND gate decoder sections $32_1$, $32_2$, as indicated. The details of the NAND gate decoder section 30 will be described in detail in connection with FIG. 3. Suffice it to say here however, that NAND gate decoder section $32_1$ is coupled to array section $20_1$ of the memory array 12 while decoder section $32_2$ is coupled to array section $20_2$ of memory array 12, as indicated. It is further noted that while both the true and complement signals on lines $A_5'$–$A_{11}'$ and $A_5'$–$A_{11}'$ are fed to both NAND decoder sections $32_1$ and $32_2$ only the "true" signal of the most significant bit fed to terminal $A_{12}$, i.e. the signal on line $A_{12}'$ is fed to decoder section $32_2$ while only the "complement" signal of the MSB (i.e. the signal on line $A_{12}'$) is fed NAND gate decoder section $32_1$. Further, each one of the NAND gate decoder sections $32_1$, $32_2$ includes a power input terminal $V'_{CC}$, the power input terminal $V'_{CC}$ of section $32_1$ being coupled to a NAND gate section selector 36 via line $34_1$, and the power input terminal $V'_{CC}$ of section $32_2$ being coupled to the NAND gate section selector 36 via line $34_2$, as shown. Details of NAND gate section selector 36 will be described in connection with FIG. 2. Suffice it to say here, however, that such NAND gate section selector 36 functions as a pair of switches 37a, 37b which, in response to most significant bit of the addressing signal fed to buffer $28_{12}$ via terminal $A_{12}$ couples a $+V_{CC}$ power supply to either NAND gate decoder section $32_1$ or, alternatively, NAND gate decoder section $32_2$ selectively in accordance with the logical state of the most significant bit of the addressing signal. Thus, as will be described in detail hereinafter if the logical state of the most significant bit of the addressing signal fed to terminal $A_{12}$ is a logical 0 (i.e. a "low" voltage signal) thereby indicating that the row of memory elements 14 being addressed is in memory array section $20_1$ of such array 12 the power supply $+V_{CC}$ is electrically coupled, via switch 37a of NAND gate section selector 36, to decoder section $32_1$ and is electrically decoupled, via switch 37b of NAND gate section selector 36, from NAND gate section $32_2$; on the other hand, if the most significant bit of the addressing signal fed to terminal $A_{12}$ is a logical 1 indicating that the addressed row of memory elements 14 being addressed is in memory array section $20_2$ then the $+V_{CC}$ power source is electrically decoupled, via switch 37a of NAND gate section selector 36, from decoder section $32_1$ and is electrically coupled, via switch 37b of NAND gate section selector 36, to decoder section $32_2$ to thereby allow such decoder section $32_1$ to address one of the row of memory elements 14 in the array section $20_2$ of the memory array 12. In this way, only one-half of the NAND gates in the NAND gate section 30 is enabled, or powered, during the reading operation of the integrated circuit memory 10.

Figure 2:
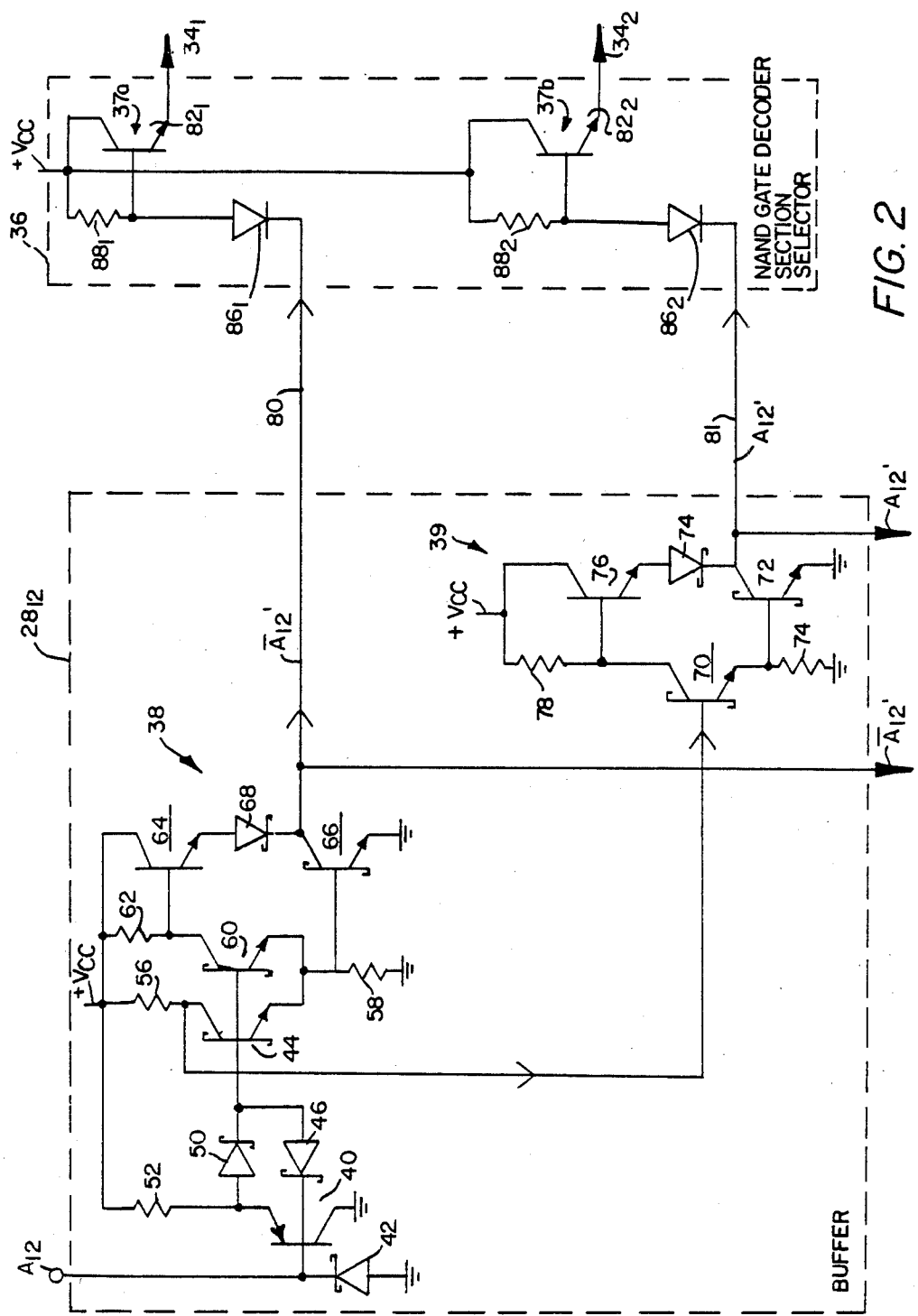
FIG. 2 is a schematic diagram of an exemplary one of the buffers used in the integrated circuit memory of FIG. 1 and of a decoder section selector used in the integrated circuit memory of FIG. 1.

Referring now to FIG. 2, buffer circuit $28_{12}$ is shown to include an inverter section 38 and a buffer 39. Inverter section 38 includes an PNP transistor 40 having its base electrode coupled to terminal $A_{12}$, and to ground through a Schottky diode 42, as shown. The base electrode of transistor 40 is also coupled to the base electrode of a Schottky transistor 44 through a Schottky diode 46, as indicated. The collector electrode of transistor 40 is connected to ground as shown. The emitter electrode of transistor 40 is also coupled to the base electrode of transistor 44 through a Schottky diode 50 and to a $+V_{CC}$ supply through a resistor 52, as indicated. The collector electrode of transistor 44 is also connected to the $+V_{CC}$ source through a resistor 56, as indicated, while the emitter electrode of such transistor 44 is connected to ground through a resistor 58 and to the emitter electrode of a Schottky transistor 60, as indicated. The base electrodes of transistors 44 and 60 are electrically connected together as shown while the collector electrode of transistor 60 is connected to $+V_{CC}$ through resistor 62 and is also connected to the base electrode of transistor 64. The collector electrode of transistor 64 is connected to $+V_{CC}$ and the emitter electrode thereof is connected to the collector electrode of Schottky transistor 66 through a Schottky diode 68, as shown. The base electrode of transistor 66 is connected to the emitter electrodes of transistors 44 and 60 and the emitter electrode of transistor 66 is connected to ground, as shown. The collector electrode of transistor 66 provides an output which is the "complement" of the binary signal fed to terminal $A_{12}$ and is connected to line $A'_{12}$, as shown. More particularly, if the logical signal at terminal $A_{12}$ is 1, that is a "high" voltage signal, transistor 40 is placed in a nonconducting state. Diode 50 is forward biased placing transistors 44 and 60 in a conducting state with transistor 66 being driven into saturation thereby producing a "low" voltage, or logical 0 signal at the collector electrode of transistor 66. Conversely, when the logical state of the signal fed to terminal $A_{12}$ is 0, or a "low" voltage signal, transistor 40 is placed into a conducting condition placing transistors 44, 60, and 66 in a non-conducting condition with the result that the collector electrode of transistor 66 goes towards $+V_{CC}$ or "high" producing a logical 1 signal at the collector electrode of transistor 66.

The collector electrode of transistor 44 is coupled to buffer 39 and more particularly to the base electrode of Schottky transistor 70. The emitter electrode of transistor 70 is coupled to the base electrode of Schottky transistor 72, and to ground through a resistor 74, as shown. The emitter electrode of transistor 72 is also connected to ground with the collector electrode thereof coupled to the $V_{CC}$ supply through a Schottky diode 74 and through a transistor 76, as shown. Transistor 76 has its base electrode connected to the collector electrode of transistor 70 and also to the $+V_{CC}$ supply through a resistor 78, as indicated. The collector electrode of transistor 72 produces a "true" signal of the binary signal fed to the terminal $A_{12}$ and is connected to line $A_{12'}$, as shown. More particularly, if the logical signal at $A_{12}$ is 1 and transistor 40 is placed in a non-conducting condition as noted above transistor 44 is placed in a conducting condition. Further, with such transistor 44 in a conducting condition a relatively low voltage is produced at the collector electrode thereof, such low voltage being insufficient to place transistors 70 and 72 in a conducting condition with the result that a relatively "high" voltage is produced at the collector electrode of transistor 72 and hence a logical 1 signal, or "true" signal of the bit fed to terminal $A_{12}$, is produced on line $A_{12'}$. Conversely, if the logical signal fed to terminal $A_{12}$ is 0, transistor 40 conducts while transistor 44 is placed in a non-conducting condition. Therefore, the collector electrode of transistor 44 goes towards $+V_{CC}$ and a relatively "high" voltage is thereby fed to the base electrode of transistor 70 placing such transistor 70 in a conducting state and driving transistor 72 into saturation producing a relatively "low" voltage at the collector electrode of transistor 72 and hence the "true" signal of the logical signal fed to terminal $A_{12}$ is again produced on line $A_{12'}$.

The signals produced at the collector electrodes of transistors 66 and 72 are fed to the NAND gate section selector 36 via lines 80, 81, respectively, as shown. The NAND gate section selector 36 includes a pair of transistors $82_1$, $82_2$ which function as switches 37a, 37b, respectively as described in connection with FIG. 1 above. The emitter electrodes of transistors $82_1$, $82_2$ are connected to the $+V'_{CC}$ terminals of the decoder sections $32_1$, $32_2$ via lines $34_1$, $34_2$ respectively, as indicated in FIG. 1. The collector electrodes of transistors $82_1$ $82_2$ are connected to the $+V_{CC}$ supply. Line 80, connects the collector electrode of transistor 66 to the base electrode of transistor $82_1$ via a diode $86_1$, as indicated. A resistor $88_1$ is connected between the base electrode of transistor $82_1$ and the $+V_{CC}$ source, as shown. Likewise, conductor 81 connects the collector electrode of transistor 72 to the base electrode of transistor $82_2$ via a diode $86_2$, as shown. Further, the resistor $88_2$ is connected between the $+V_{CC}$ source and the base electrode of transistor $82_2$, as indicated. In operation when the logical signal (i.e. the MSB) fed to terminal $A_{12}$ is logical 1 indicating that the memory elements 14 array in section $20_2$ (FIG. 1) is being addressed, then, as indicated above, a relatively "low" voltage is produced on line 80 forward biasing diode $86_1$, producing an insufficient voltage at the base electrode of transistor $82_1$ to place such transistor 82 into a conducting condition thereby electrically decoupling the $+V_{CC}$ source from line $34_1$ (and hence from terminal $V'_{CC}$ of section $32_1$ (FIG. 1)); on the other hand, the logical 1 signal produced at terminal $A_{12}$ produces a relatively "high" voltage on line 81 thereby reverse biasing diode $86_2$ with the result that resistor $88_2$ provides sufficient base current to transistor $82_2$ to forward bias such transistor $82_2$ placing such transistor $82_2$ in a conducting condition and thereby electrically connect the $+V_{CC}$ supply to line $34_2$ and hence to terminal $V'_{CC}$ of section $32_2$ (FIG. 1) to allow such section $32_2$ to address section $30_2$ of array 12 as required by the addressing signal. Conversely, when the logical signal at terminal $A_{12}$ is 0 transistor $82_1$ is forward biased and the $+V_{CC}$ source is electrically coupled to line $34_1$ and hence to section $32_1$ to allow section $32_1$ to address array section $20_1$ as required by the addressing signal while transistor $82_2$ is placed in a nonconducting condition to thereby electrically decouple the $+V_{CC}$ source from line $34_2$ (and hence from section $32_2$).

Figure 3:
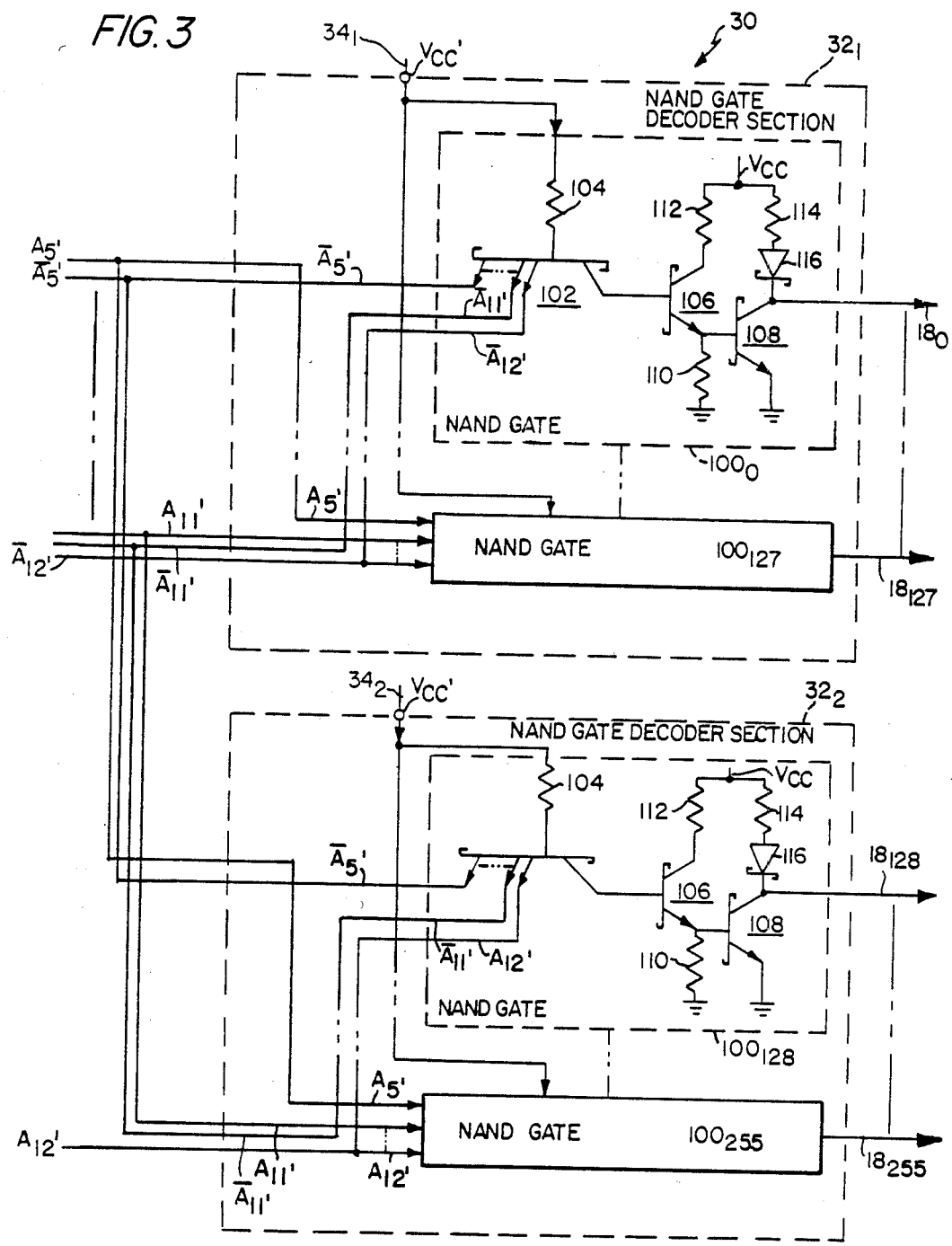
FIG. 3 is a schematic diagram of NAND gate sections of an X (row) address decoder circuit used in the integrated circuit memory of FIG. 1.

Referring now to FIG. 3, NAND gate section 30 is shown to include in detail NAND gate decoder sections $32_1$ and $32_2$. Thus NAND gate section $32_1$ includes a plurality of NAND gates $100_0$–$100_{127}$ while NAND gate section $32_2$ includes a plurality of NAND gates $100_{128}$–$100_{255}$, as shown. Each one of the NAND gates $100_0$–$100_{255}$ is identical in construction and an exemplary pair thereof, here NAND gates $100_0$, $100_{128}$, are shown to include an input multi-emitter Schottky transistor 102 coupled to the $V'_{CC}$ terminal via resistor 104. The collector electrode of transistor 102 is connected to the base of Schottky transistor 106 which has its emitter electrode connected to Schottky transistor 108, as shown and also to ground through resistor 110, as shown. The emitter electrode of transistor 108 is connected to ground, as shown. The collector electrode of transistor 106 is connected to the $+V_{CC}$ supply through a resistor 112 while the collector electrode of transistor 108 is connected to the $V_{CC}$ supply through a resistor 114 and Schottky diode 116. Further the collector electrode of transistor 108 of gate $100_0$ is connected to row conductor $18_0$, as shown. NAND gate $100_0$ has the emitter electrodes of transistor 102 coupled to the complement signals of the bits of the addressing signal fed to terminals $A_5$–$A_{12}$, as shown. Thus, transistor 108 of gate $100_0$ is driven into saturation only when all of the signals on lines $A'_5$–$A'_{12}$ are "high" with the result that row conductor $18_0$ is "low" or "addressed" only when the bits fed to terminals $A_5$–$A_{12}$ are "low" on logical 0. Thus NAND gate $100_0$ lowers the voltage on line $18_0$ to address such line $18_0$ when the bits fed to terminals $A_{12}$–$A_5$ are $(00000000)_2 = (0)_{10}$. Likewise NAND gate $100_{127}$ is fed by lines $A'_5$–$A'_{11}$ and $A_{12}$ to lower the voltage on line $18_{127}$ only when the bits fed to terminals $A_{12}$–$A_5$ are $01111111 = (127)_{10}$, respectively. In the general case than NAND gates $100_0$–$100_{127}$ address or lower the voltage on row conductors $18_0$–$18_{127}$ when the bits fed to terminals $A_{12}$–$A_5$ are $(0)_{10}$–$(127)_{10}$, respectively. In like manner, NAND gates $100_{128}$–$100_{255}$ address or lower the voltage on row conductors $18_{128}$–$18_{255}$ when the bits fed to terminals $A_{12}$–$A_5$ are $(128)_{10}$–$(255)_{10}$, respectively. Further, in response to the most significant bit of such addressing signal, i.e. the bit fed to terminal $A_{12}$, the decoder selection section 36 (FIGS. 1 and 2) couples the $+V_{CC}$ supply, the $+V'_{CC}$ terminal of only one of the two NAND gate decoder sections $32_1$, $32_2$ and more particularly couples such power source to the particular one of the pair of decoder sections $32_1$, $32_2$ which is addressing the addressed one of the row conductors $18_0$–$18_{255}$. Thus, as mentioned above, if the logical state of the most significant bit is 1 thereby indicating that the addressed one of the row conductors $18_0$–$18_{255}$ is in array section $20_2$, power is supplied from the $+V_{CC}$ supply to the $V'_{CC}$ terminal of decoder section $32_2$ and such power source is electrically decoupled from the $V'_{CC}$ terminal of section $32_1$; conversely, if the most significant bit of the addressing signal is 0 thereby indicating that the addressed one of the row conductors $18_0$–$18_{255}$ is in array section $20_1$ the section selector 36, in response to the logical state of the most significant bit, electrically decouples the $+V_{CC}$ supply from $V'_{CC}$ terminal of decoder section $32_2$ and electrically interconnects such supply to the $V'_{CC}$ terminal of NAND gate decoder section $32_1$. It follows then that during the reading operation of the ROM 10 only one-half of the 256 NAND gates $100_0$–$100_{256}$ is powered thereby reducing the power consumption in resistors 104 of the 255 NAND gates $100_0$–$100_{255}$.

Figure 4:
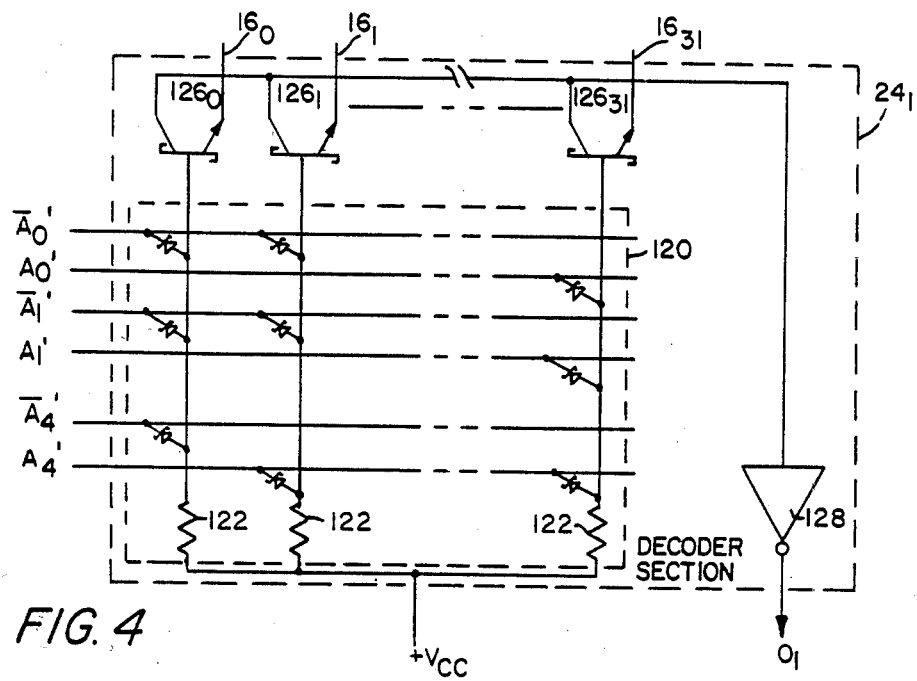
FIG. 4 is a schematic diagram of a diode decoder of a Y (column) address decoder circuit used in the integrated circuit memory of FIG. 1.

Referring now to FIG. 4, an exemplary one of the eight identical decoder sections $24_1$–$24_8$, here decoder section $24_1$, is shown to include a conventional diode decoder matrix 120 coupled to the $+V_{CC}$ power source through resistors 122 as shown. In response to the "true" and "complement" signals of the five least significant bits of the addressing signals, i.e. the bits fed to terminals $A_0$–$A_4$, the diode decoder matrix 120 coupled the $+V_{CC}$ supply and one of the resistors 122 to a one of the base electrodes of thirty-two Schottky transistors $126_0$–$126_{31}$ selectively in accordance with the binary state of the bits fed to terminals $A_0$–$A_4$ to thereby turn such transistor to a conducting conductor. The collector electrodes of transistors $126_0$–$126_{31}$ are connected together and to the input of a conventional inverter 128, as shown. The emitter electrode of transistors $126_0$–$126_{31}$ are connected to column conductors $16_0$–$16_{31}$, respectively, as shown. Thus, here the transistors $126_0$–$126_{31}$ are placed in a conducting conductor when the bits fed to terminals $A_4$ through $A_0$ are $(00000)_2=(0)_{10}$ through $(31)_{10}$, respectively. Thus, when the bits fed to terminals $A_4$–$A_0$ are 00001 transistor $126_1$ is placed in a conducting state to electrically couple column conductor $16_1$ to the input of inverter 128.

In operation then a particular one of the row conductors $18_0$–$18_{255}$ is addressed or selected by the bits fed to terminal $A_5$–$A_{12}$ and a particular one of the 32 columns of conductors in each of the eight sets thereof: $16_0$–$16_{31}$ through $16_{224}$–$16_{255}$ is selected in response to the bits fed to the terminals $A_0$–$A_4$ to thereby address one of the 256 eight bit words stored in array 12. For example, if the bits fed to terminal $A_{12}$–$A_0$ are 1000000000001 the row conductor $18_{128}$ is addressed, i.e. made "low" and column indicators $16_1$, $16_{33}$, $16_{65}$, $16_{97}$, $16_{129}$, . . . and $16_{225}$ are addressed, i.e. coupled to the inverter 128 of decoder selectors $24_1$–$24_8$ and hence to the output terminals $0_1$–$0_8$, respectively. Thus, considering row conductor $18_{128}$ and column conductor $16_{31}$ (FIG. 1) if there is a connected diode for the memory element 14b at the cross point of such row conductor and column conductor, the voltage at the input to inverter 128 will be "low" producing a high or logical 1 output at output terminal $0_1$; however, if such diode is not connected for memory element 14b such the voltage at the input inverter 128 will be "high" and the voltage of the output $0_1$ will be "low" or logical 0. In any event, NAND gate of decoder section $32_1$ will be coupled to the $+V_{CC}$ supply via NAND gate section selector 36 when the bit fed to terminal $A_{12}$ indicates that the memory element 14 associated with row conductor $18_0$–$18_{127}$ is being addressed while NAND gate section $32_2$ is decoupled from such $+V_{CC}$ supply and on the other hand when the bit fed to terminal $A_{12}$ indicates that the memory element 14 associated with columns $18_{128}$–$18_{255}$ are being addressed NAND gate section $32_2$ is coupled to the $+V_{CC}$ supply through selector 36 while NAND gate section 36 is decoupled from such $+V_{CC}$ supply. It is noted that while line $A'_{12}$ is shown coupled to NAND gate section $32_1$ and line $A'_{12}$ is shown coupled to NAND gate section $32_2$ since the control of each section is by power being or not being fed to lines $34_1$, $34_2$, the coupling of lines $A'_{12}$, $A'_{12}$ to section $32_2$, $32_1$ may be eliminated.

Figure 6:
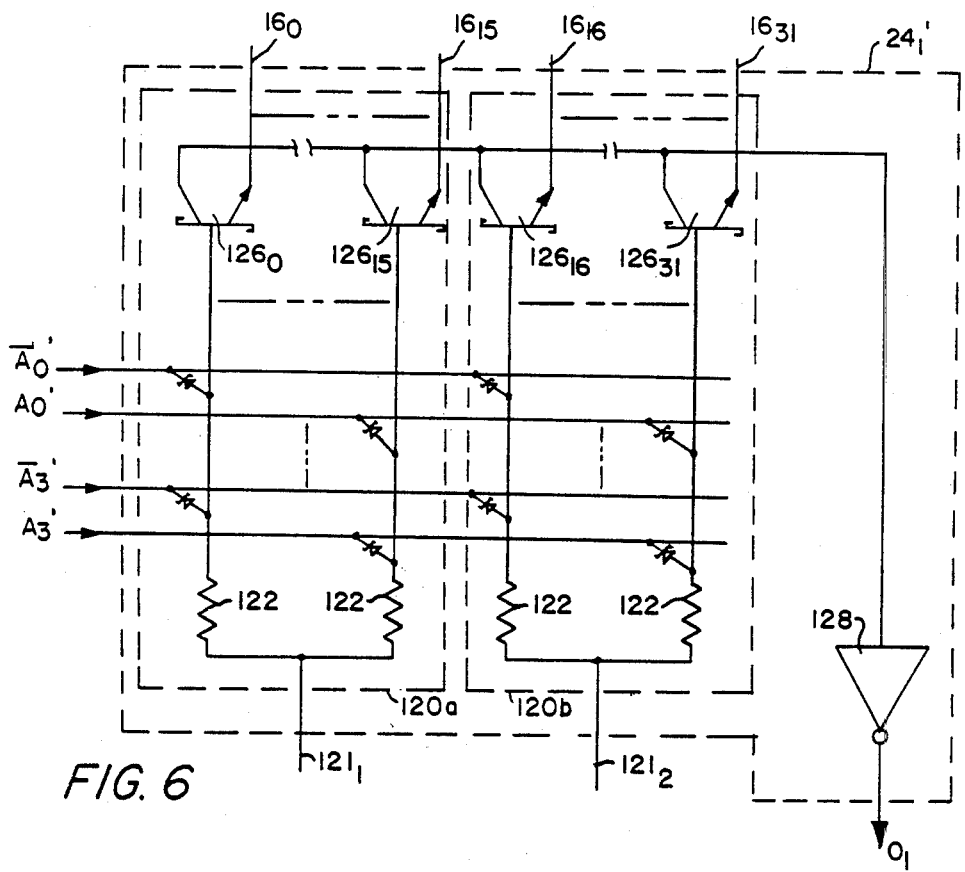
FIG. 6 is a schematic diagram of a diode decoder of a Y address circuit used in the integrated circuit memory of FIG. 5.
Figure 5:
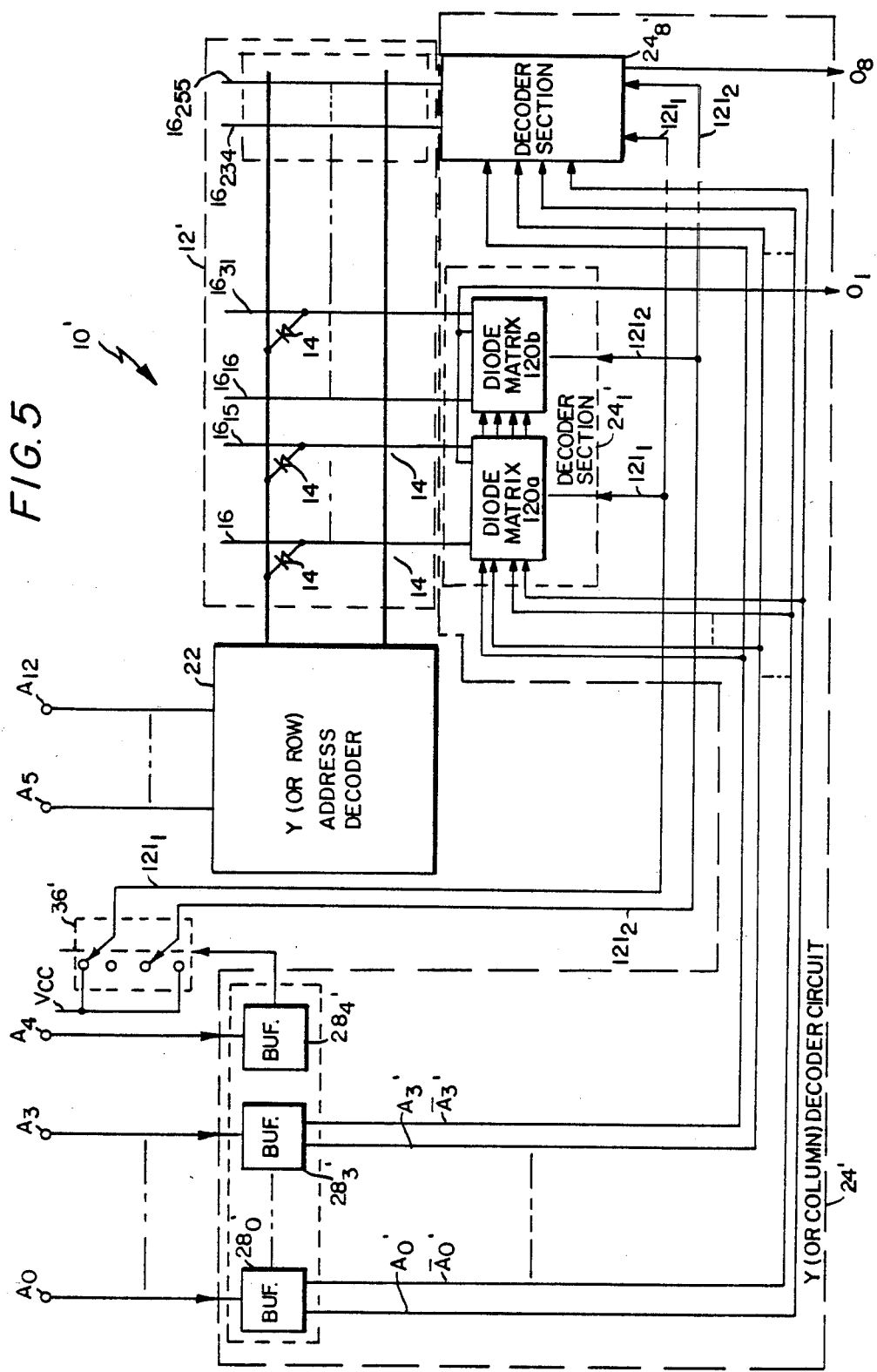
FIG. 5 is a schematic diagram of an integrated circuit memory in accordance with an alternative embodiment of the invention.

Referring now to FIG. 5, an alternative embodiment of the invention is shown. There the read-only memory circuit 10' has the Y or (column) decoder circuit 24' configured so that each one of the decoder sections $24'_1$–$24'_8$ has two diode matrix sections 120a, 120b, as shown in FIG. 6. It is noted that a diode matrix section selector 36' (FIG. 5) is provided. The selector 36' is fed by buffer $28'_4$ in a manner equivalent to that of buffer $28_{12}$ (FIG. 1); here however, selector 36' couples the $+V_{CC}$ supply to either section 120a or 120b selectively in accordance with the logical state of the bit fed to terminal $A_4$ (i.e. the MSB of the portion of the addressing signal used to address the column conductors.) Thus, if the bit fed to terminal $A_4$ is a logical 0 indicating that one of the sixteen column conductors in the eight sets thereof (i.e. one of the column conductors in the sets $16_0$–$16_{15}$, . . . $16_{224}$–$16_{239}$) are being addressed selector 36' couples $+V_{CC}$ to diode decoder matrix 120a in the eight decoder sections $24'_1$–$24'_8$ via line $121_1$ while the matrix 120b in each of such eight sections is decoupled from $+V_{CC}$. Conversely, if the logical bit fed to terminal $A_4$ is logical 1 indicating that the one of the column conductors $16_{16}$–$16_{31}$, . . . $16_{240}$–$16_{255}$ is being addressed selector 36' couples the $+V_{CC}$ supply to diode matrix decoder 120b in each of the eight decoder sections $24'_1$–$24'_8$ via line $121_2$ while decoder 120a in each of the eight sections $24'_1$–$24'_8$ is decoupled from $+V_{CC}$. In this manner, power is dissipated in only half of the resistors 122 in the decoder sections $24'_1$–$24'_8$. It is also noted that signals on lines $A'_0$–$A'_3$ and $A'_0$–$A'_3$ are the only signals which are needed by the decoder sections $24'_1$–$24'_8$ since the "decoding" of the bit fed to terminal $A_4$ is in effect provided by selector 36' in its coupling of power to any one of the matrices 120a or 120b.

Having described a preferred embodiments of the invention, it is now evident that other embodiments incorporating these concepts may be used. For example, while a 65K memory has been shown, the invention may be used with memories of greater or lesser storage capacity. Further, when the rows of conductors $18_0$–$18_{255}$ have been arranged in a binary pattern, a different pattern such as a Gray code pattern may be used in which case a bit other than the most significant bit could be used to activate the NAND gate section selector. Further, while the memory array had beeen divided into two sections, that is array section $20_1$ and $20_2$, larger arrays may be segmented into more sections in which case in addition to responding to the, for example, if the array was to be segmented into four sections in addition to the section selector would have to be appropriately modified to couple the power source to one of the four sections in response to not only the most significant bit but the two most significant bits of the addressing signal. Further, it is felt therefore that this invention should not be restricted to the preferred embodiment but rather should be limited only by the spirit and scope of the appended claims.

What is claimed is:

1. A memory circuit comprising:
   (a) a matrix of memory elements;
   (b) a decoder circuit responsive to an address signal for selectively addressing the memory elements in the matrix, said decoder circuit having a plurality of sections for selectively addressing the meory elements in different, corresponding sections of the matrix;
   (c) a decoder section selector for electrically coupling one of the sections of the decoder to a power source while electrically decoupling the remaining sections of the decoder from said power source selectively in response to the address signal; and
   (d) wherein the decoder circuit comprises a plurality of gates each one thereof having an input transistor coupled to the address signals and to the decoder section selector and an output transistor fed by the input transistor having an output electrode coupled to the matrix of memory elements and an additional electrode adapted for coupling to the power source independent of the decoder section selector.

2. The memory circuit recited in claim 1 wherein the matrix of memory elements includes a plurality of non-volatile memory elements.

* * * * *

UNITED STATES PATENT OFFICE
CERTIFICATE OF CORRECTION

Patent No. 4,561,070                    Dated December 24, 1985

Inventor(s) Bruce G. Armstrong

It is certified that error appears in the above-identified patent and that said Letters Patent are hereby corrected as shown below:

Column 3, Lines 50-51: Change "$A_0'-A_{12}'$" to --$\overline{A}_0'-\overline{A}_{12}'$--;

Column 3, Line 52: Change "$A_5'-A_{12}'$" (second occurrence to --$\overline{A}_5'-\overline{A}_{12}'$--;

Column 3, Line 64: Change "$A_5'-A_{11}'$" (second occurrence to --$\overline{A}_5'-\overline{A}_{11}'$--;

Column 4, Line 1: Change "$A_{12}'$" to --$\overline{A}_{12}'$--;

Column 5, Line 5: Change "$A'_{12}$" to --$\overline{A}'_{12}$--;

Column 6, Line 60: Change "$A'_5-A'_{12}'$" to --$\overline{A}'_5-\overline{A}'_{12}'$--;

Column 6, Line 66: Change "$A_{12}$" to --$\overline{A}_{12}$--;

Column 8, Line 25: Change "$A'_{12}$" to --$\overline{A}'_{12}$--;

UNITED STATES PATENT OFFICE
CERTIFICATE OF CORRECTION

Patent No. 4,561,070          Dated December 24, 1985

Inventor(s) Bruce G. Armstrong

It is certified that error appears in the above-identified patent and that said Letters Patent are hereby corrected as shown below:

Column 8, Line 29: Change "$A'_{12}$" (second occurrence) to $--\overline{A}'_{12}--$;

Column 8, Line 60: Change "$A'_0-A'_3$" (second occurrence to $--\overline{A}'_0-\overline{A}'_3--$; and Column 10, Claim 1, Line 4: Change "meory" to --memory--.

Signed and Sealed this

Twenty-ninth Day of July 1986

[SEAL]

Attest:

DONALD J. QUIGG

Attesting Officer     Commissioner of Patents and Trademarks